(12) United States Patent  (10) Patent No.: US 8,815,017 B2
Ozaki et al.  (45) Date of Patent: Aug. 26, 2014

(54) METHOD OF MANUFACTURING SEMICONDUCTOR DEVICE AND METHOD OF CLEANING SEMICONDUCTOR SUBSTRATE

(71) Applicants: Shirou Ozaki, Kawasaki (JP);
Masayuki Takeda, Kawasaki (JP);
Norikazu Nakamura, Kawasaki (JP);
Junichi Kon, Kawasaki (JP)

(72) Inventors: Shirou Ozaki, Kawasaki (JP);
Masayuki Takeda, Kawasaki (JP);
Norikazu Nakamura, Kawasaki (JP);
Junichi Kon, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/951,803

(22) Filed: Jul. 26, 2013

(65) Prior Publication Data

US 2013/0306102 A1 Nov. 21, 2013

Related U.S. Application Data

(62) Division of application No. 13/397,837, filed on Feb. 16, 2012, now abandoned.

(30) Foreign Application Priority Data

Feb. 25, 2011 (JP) .................. 2011-040544

(51) Int. Cl.
*H01L 21/00* (2006.01)
*B08B 3/08* (2006.01)
*H01L 21/02* (2006.01)
*H01L 21/306* (2006.01)

(52) U.S. Cl.
USPC ............ 134/1.3; 438/905; 134/33; 134/157; 257/E21.228

(58) Field of Classification Search
CPC ............... H01L 21/67057; H01L 21/02052; B08B 3/10
USPC ....................................... 156/345.23
See application file for complete search history.

(56) References Cited

U.S. PATENT DOCUMENTS

| 4,355,974 | A | * | 10/1982 | Lee ................................. 432/253 |
| 5,593,505 | A | * | 1/1997 | Erk et al. ......................... 134/1.3 |
| 5,672,212 | A | * | 9/1997 | Manos ............................. 134/1.3 |
| 5,853,284 | A | * | 12/1998 | Ohzeki et al. .................. 414/757 |
| 6,337,030 | B1 | * | 1/2002 | Sakaguchi ....................... 216/91 |
| 2003/0098047 | A1 | * | 5/2003 | Herbst et al. .................. 134/25.4 |

(Continued)

FOREIGN PATENT DOCUMENTS

CN 101271835 9/2008
CN 101312164 A 11/2008

(Continued)

OTHER PUBLICATIONS

Japanese Office Action mailed May 7, 2013 in counterpart application No. 2009-539088.

(Continued)

*Primary Examiner* — Colleen Matthews
*Assistant Examiner* — Regan J Rundio
(74) *Attorney, Agent, or Firm* — Kratz, Quintos & Hanson, LLP

(57) ABSTRACT

A method of manufacturing a semiconductor device includes: holding a semiconductor substrate with a surface inclined with respect to the vertical direction and the horizontal direction; and immersing the semiconductor substrate in a cleaning solution including an acid.

8 Claims, 10 Drawing Sheets

(56) References Cited

U.S. PATENT DOCUMENTS

| | | |
|---|---|---|
| 2004/0200501 A1 | 10/2004 | Treur |
| 2005/0121051 A1 | 6/2005 | Okano et al. |
| 2005/0142882 A1 | 6/2005 | Kida et al. |
| 2006/0003134 A1 | 1/2006 | Uemura et al. |
| 2007/0029617 A1 | 2/2007 | Kato |
| 2008/0093709 A1* | 4/2008 | Matsuura et al. ............. 257/632 |
| 2008/0233753 A1 | 9/2008 | Idani |
| 2009/0266711 A1* | 10/2009 | Ishibashi et al. ......... 204/298.07 |

FOREIGN PATENT DOCUMENTS

| | | |
|---|---|---|
| CN | 100477236 | 4/2009 |
| CN | 201655761 U | 11/2010 |
| JP | 09-260331 | 10/1997 |
| JP | 2009-164226 | 7/2009 |
| TW | 473863 | 1/2002 |

OTHER PUBLICATIONS

Chinese Office Action dated Feb. 17, 2014 issued in counterpart application No. 201210042246.6 with partial English translation.

Examination Report from the Intellectual Property Office of Taiwan dated May 12, 2014 issued in counterpart application No. 101105777 with English translation.

* cited by examiner

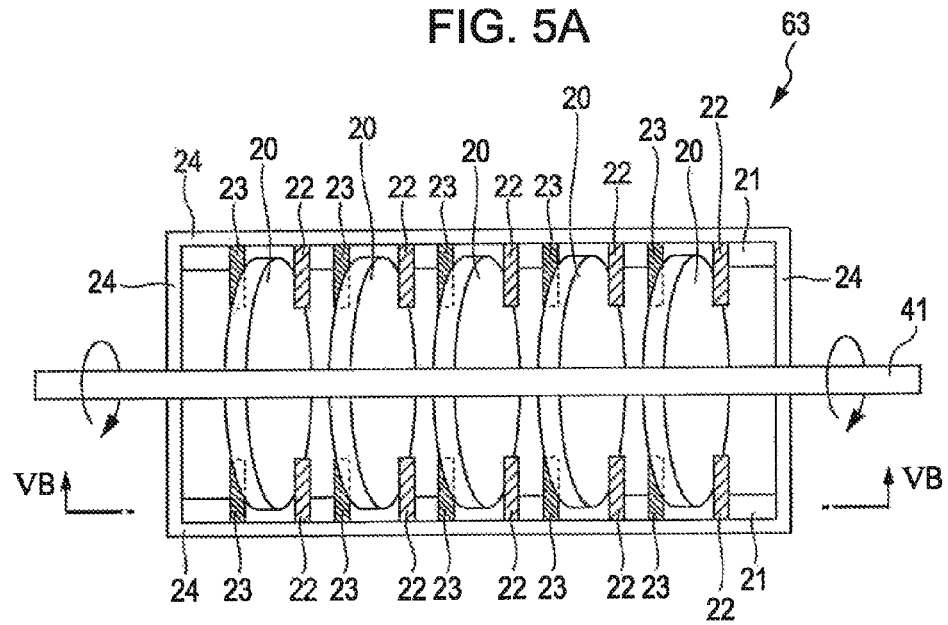
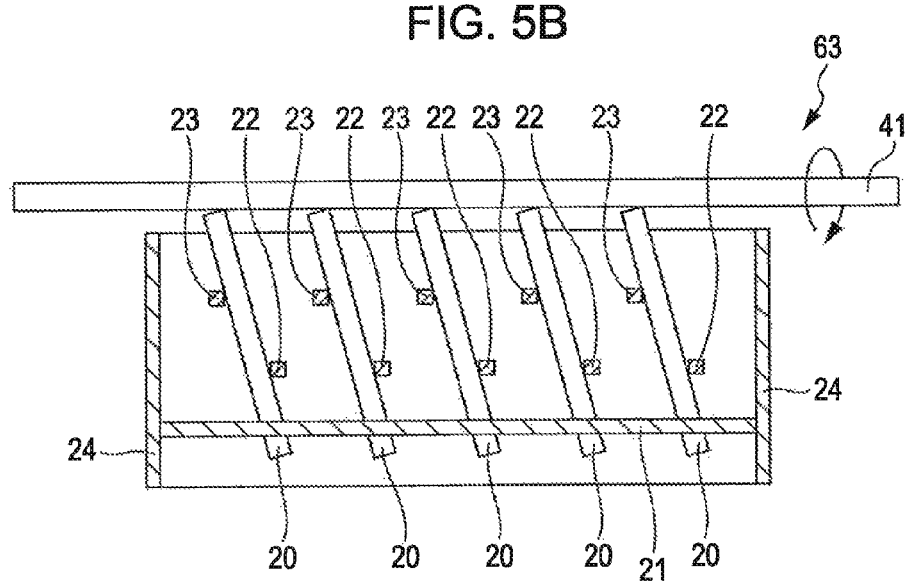

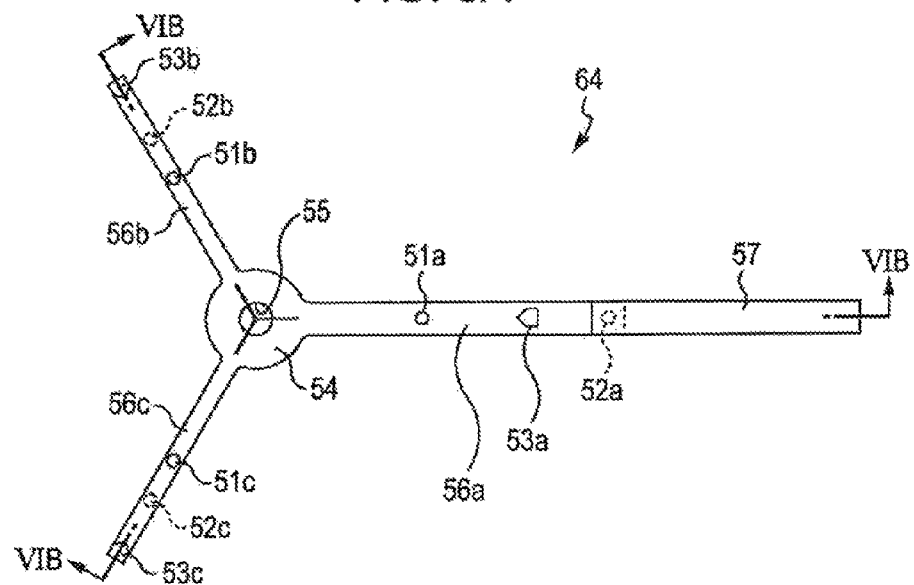
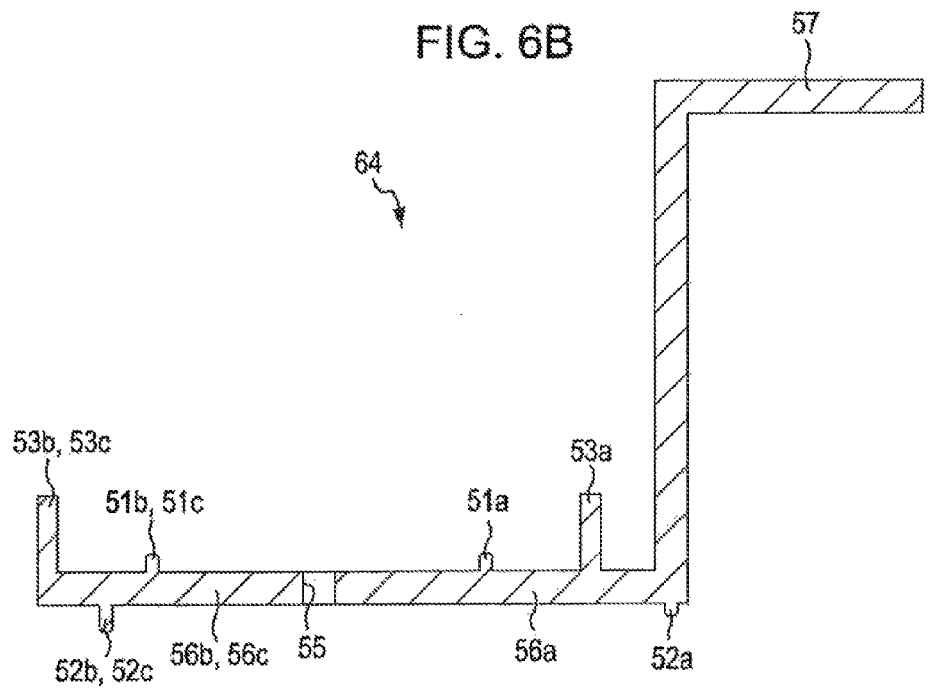

METHOD OF MANUFACTURING SEMICONDUCTOR DEVICE AND METHOD OF CLEANING SEMICONDUCTOR SUBSTRATE

CROSS-REFERENCE TO RELATED APPLICATIONS

This application is a divisional application of U.S. patent application Ser. No. 13/397,837, filed Feb. 16, 2012, which application claims priority of Japanese Patent Application No. 2011-040544, filed Feb. 25, 2011, the entire contents of which are incorporated herein by reference.

FIELD

The embodiments discussed herein are related to a method of manufacturing a semiconductor device and a method of cleaning a semiconductor substrate.

BACKGROUND

Electron devices in which a GaN layer used as an electron transport layer and an AlGaN layer are disposed on a substrate, for example, compound semiconductor devices, include a GaN-based high electron mobility transistor (HEMT). In a GaN-based HEMT, a high-concentration two-dimensional electron gas (2DEG) generated at the heterojunction interface between AlGaN and GaN is used.

The bandgap of GaN is 3.4 eV, which is larger than the bandgap of Si (1.1 eV) and the bandgap of GaAs (1.4 eV). GaN has a high breakdown field strength and a high saturated electron velocity. GaN may be used as the material for a high-voltage operating and high-output compound semiconductor device, for example, the material for a semiconductor device for power supply. Compound semiconductor devices using a GaN-based compound semiconductor may be used as high-efficiency switching devices or high breakdown voltage power devices for electric cars. Si laterally diffused metal oxide semiconductor (LDMOS) transistors or GaAs field effect transistors (FETs) may not be suitable for high-output, high-efficiency, or high-voltage operation.

Related art is disclosed in Japanese Laid-open Patent Publication No, 2009-164226 and Japanese Laid-open Patent Publication No. 9-260331.

SUMMARY

According to one aspect of the embodiments, a method of manufacturing a semiconductor device includes: holding a semiconductor substrate with a surface inclined with respect to the vertical direction and the horizontal direction; and immersing the semiconductor substrate in a cleaning solution including an acid.

Additional advantages and novel features of the invention will be set forth in part in the description that follows, and in part will become more apparent to those skilled in the art upon examination of the following or upon learning by practice of the invention.

BRIEF DESCRIPTION OF THE DRAWINGS

FIGS. 5A and 5B illustrate an exemplary cleaning apparatus;
FIGS. 6A and 6B illustrate an exemplary cleaning apparatus.

DESCRIPTION OF EMBODIMENTS

In order to produce a GaN-based HEMT having good characteristics, residues such as particles generated in the production process may be removed. For example, in a GaN-based HEMT having a gate recess structure which enables normally "off" operation, in order to reduce the increase in leakage current caused by residues, the fluctuation in threshold voltage due to charge trapping, and the like, cleaning is performed between the formation of the recess and the formation of a gate-insulating film.

FIGS. 1A to 1H illustrate an exemplary method of manufacturing a semiconductor device. In the manufacturing method illustrated in FIGS. 1A to 1H, a GaN-based HEMT may be manufactured.

Figure 1A:
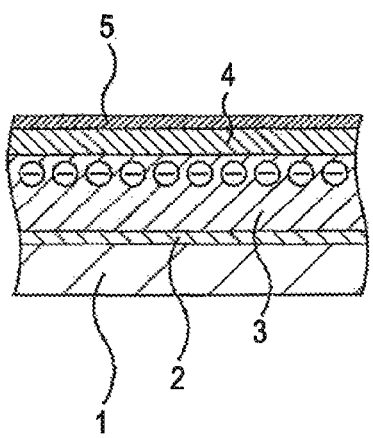
FIGS. 1A to 1H illustrate an exemplary method of manufacturing a semiconductor device.

As illustrated in FIG. 1A, a nucleation layer 2, an electron transport layer 3, an electron supply layer 4, and a cap layer 5 are formed on a substrate 1. The substrate 1 may be, for example, a SIC substrate. The nucleation layer 2 may be, for example, an AlN layer or AlGaN layer. The electron transport layer 3 may be, for example, a non-doped i-GaN layer. The electron supply layer 4 may be, for example, an n-type n-AlGaN layer. Before formation of the n-type n-AlGaN layer, a non-doped i-AlGaN layer may be formed as a spacer layer. The cap layer 5 may be, for example, an n-type n-GaN layer. The nucleation layer 2, the electron transport layer 3, the electron supply layer 4, and the cap layer 5 may be formed by a crystal growth method, such as a metal organic vapor phase epitaxy (MOVPE) method. Depending on the selection of source material gases, these layers may be continuously formed. As the source material for aluminum (Al) and the source material for gallium (Ga), for example, trimethylaluminum (TMA) and trimethylgallium (TMG) may be used respectively. As the source material for nitrogen (N), for example, ammonia (NH.sub.3) may be used. The source material for silicon (Si) included as an impurity in the electron supply layer 4, an n-AlGaN layer, or the cap layer 5, e.g., an n-GaN layer, for example, silane ($SiH_4$) may be used.

The thickness of the electron transport layer 3 may be, for example, about 3 µm. The thickness of the electron supply layer 4 may be, for example, about 30 nm. When a spacer layer is provided, the thickness of the spacer layer may be, for example, about 5 nm. The thickness of the cap layer 5 may be, for example, 10 nm. In the spacer layer, e.g., an i-AlGaN layer, and the electron supply layer 4, e.g., an n-AlGaN layer, the Al compositional ratio may be, for example, about 0.2. The electron supply layer 4, e.g., an n-AlGaN layer, and the cap layer 5, e.g., an n-GaN layer, may be doped with Si as an n-type impurity, in an amount of about $5 \times 10^{18}$ cm$^{-3}$.

In such a stacked structure, a two-dimensional electron gas (2DEG) is generated near the interface between the electron transport layer 3 and the electron supply layer 4. Strain between the electron transport layer 3 and the electron supply layer 4 increases owing to the cap layer 5, which causes a piezoelectric effect, resulting in an increase in 2DEG. Consequently, the on-state current of the GaN-based HEMT decreases, which may enable high current operation of GaN-based HEMT.

Figure 1B:
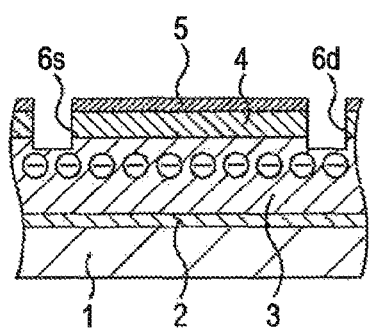

As illustrated in FIG. 1B, a recessed portion 6s and a recessed portion 6d are respectively formed in a source electrode-forming region and in a drain electrode-forming region of the cap layer 5, the electron supply layer 4, and the electron transport layer 3. In forming the recessed portions 6s and 6d, a resist pattern having openings to expose regions for forming recessed portions 6s and 6d is formed. Using the resist pattern as an etching mask, the cap layer 5, the electron supply layer 4, and the electron transport layer 3 are dry-etched. The resist pattern is removed by ashing or the like. In the dry etching, for example, a chlorine-based gas may be used as an etching gas. The dry etching may be performed, for example, under the conditions in which the flow rate of the etching gas is set at 30 sccm, the pressure is set at 2 Pa, and the applied RF power is set at 20 W. The depth of the recessed portions 6s and 6d may be arbitrarily set as long as a certain amount of electric current attributed to 2DEG flows.

Figure 1C:
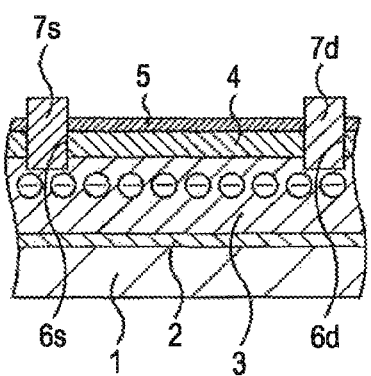

As illustrated in FIG. 1C, a source electrode 7s is formed in the recessed portion 6s, and a drain electrode 7d is formed in the recessed portion 6d. In forming the source electrode 7s and the drain electrode 7d, a resist pattern having an opening to expose the region for forming the source electrode 7s and an opening to expose the region for forming the drain electrode 7d is formed. Using the resist pattern as a deposition mask, a conductive film is formed. The conductive film attached to the resist pattern and the resist pattern is removed. For example, the source electrode 7s and the drain electrode 7d may be formed by a lift-off process. For example, a Ta film with a thickness of about 20 nm may be formed. An Al film with a thickness of about 200 nm may be formed on the Ta film. The Ta film and the Al film may be formed, for example, by a vapor deposition method. After the resist pattern is removed, heat treatment is performed at 400° C. to 1,000° C., for example at 550° C., in a nitrogen atmosphere, thereby establishes an ohmic contact.

Figure 1D:
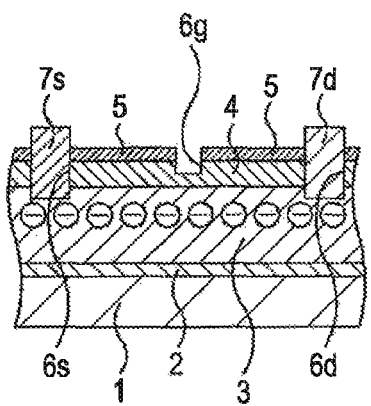

As illustrated in FIG. 1D, a recess 6g is formed in a region for forming a gate electrode 7g of the cap layer 5 and the electron supply layer 4. In forming the recess 6g, a resist pattern including an opening to expose a region for forming the recess 6g is formed. Using the resist pattern as an etching mask, the cap layer 5 and the electron supply layer 4 are dry-etched. The resist pattern is removed by ashing or the like. In the dry etching, for example, a chlorine-based gas may be used as an etching gas.

After the recess 6g is formed, by cleaning the inside of the recess 6g by a certain method, etching residues, resist residues, or the like may be removed.

Figure 1E:
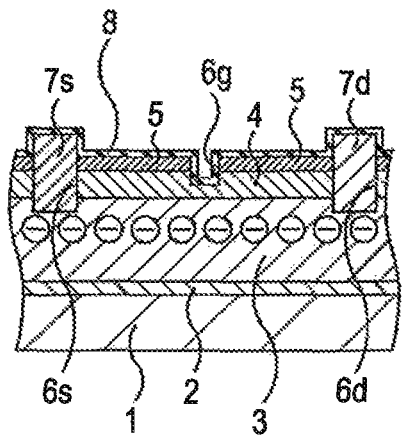

As illustrated in FIG. 1E, a gate-insulating film 8 that follows the inner surface of the recess 6g is formed. The gate-insulating film 8 may be, for example, an aluminum oxide film, a hafnium oxide film, a silicon oxide film, an aluminum nitride film, a hafnium nitride film, a silicon nitride film, or the like. The gate-insulating film 8 may be formed by an atomic layer deposition (ALD)) method or the like. The thickness of the gate-insulating film 8 may be about 5 to 100 nm, for example, about 40 nm.

Figure 1F:
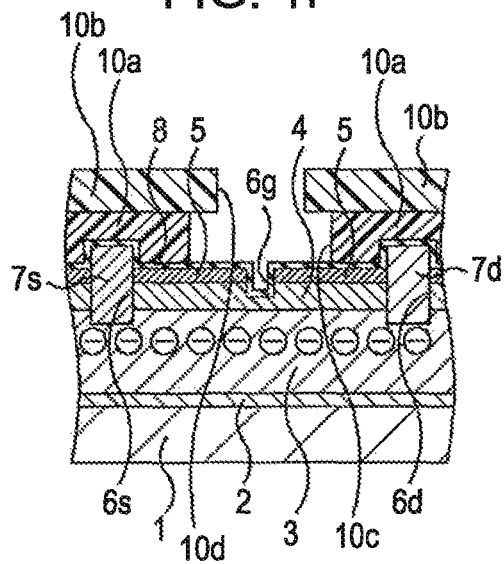

As illustrated in FIG. 1F, a lower layer resist pattern 10a including an opening 10e to expose a region for forming a gate electrode and an upper resist pattern 10b including an opening 10d which is narrower than the opening 10c is formed on the gate-insulating film 8. In forming the lower layer resist pattern 10a and the upper layer resist pattern 10b, an alkali-soluble resin, such as PMGI (trade name) manufactured by MicroChem Corp., U.S.A., is applied onto the gate-insulating film 8, for example, by a spin coating method, followed by heat treatment to form a resist film. Then, a photosensitive resist material, such as PF132-A8 (trade name) manufactured by Sumitomo Chemical Co., Ltd. is applied, for example, by a spin coating method, followed by heat treatment to form a resist film. By performing ultraviolet exposure, an opening 10d with a width of about 0.8 µm is formed in the upper layer resist film, and thus the upper resist pattern 10b including the opening 10d is formed. Using the upper layer resist pattern 10b as a mask, the lower layer resist film is wet-etched with an alkaline developer. Thereby, the lower layer resist pattern 10a having an opening 10e is formed. For example, as illustrated in FIG. 1F, a multilayer resist film having an eaves-like structure is formed.

Figure 1G:
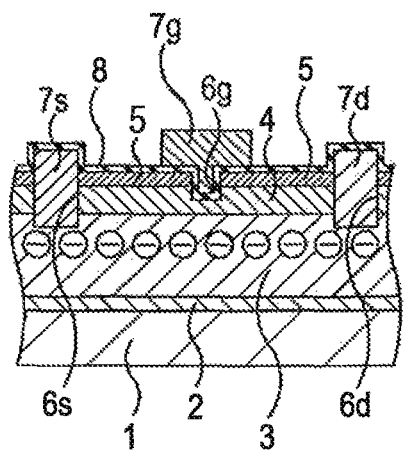

As illustrated in FIG. 1G, a gate electrode 7g is formed on the gate-insulating film 8 so as to fill the recess 6g. In forming the gate electrode 7g, using the lower resist pattern 10a and the upper resist pattern 10b as a deposition mask, a conductive film is formed. The conductive film attached to the upper layer resist pattern 10b, the lower layer resist pattern 10a, and the upper layer resist pattern 10b are removed. The gate electrode 7g is formed by a lift-off process. For example, an Ni film with a thickness of about 10 nm may be formed. An Au film with a thickness of about 300 nm may be formed on the Ni film. The Ni film and the Au film may be formed, for example, by a vapor deposition method. The lower layer resist pattern 10a and the upper layer resist pattern 10b may be removed, for example, using a heated organic solvent.

Figure 1H:
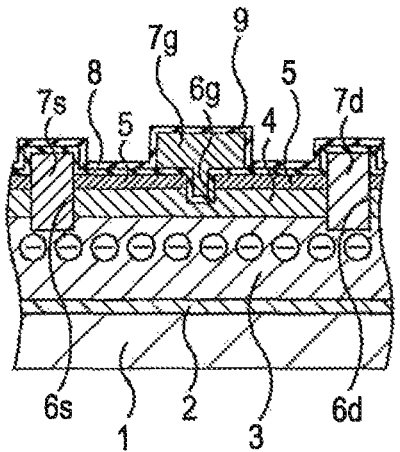

As illustrated in FIG. 1H, a protective film 9 is formed. Contact holes, interconnect lines, and the like are formed. In this way, as GaN-based HEMT is fabricated.

Figure 2A:
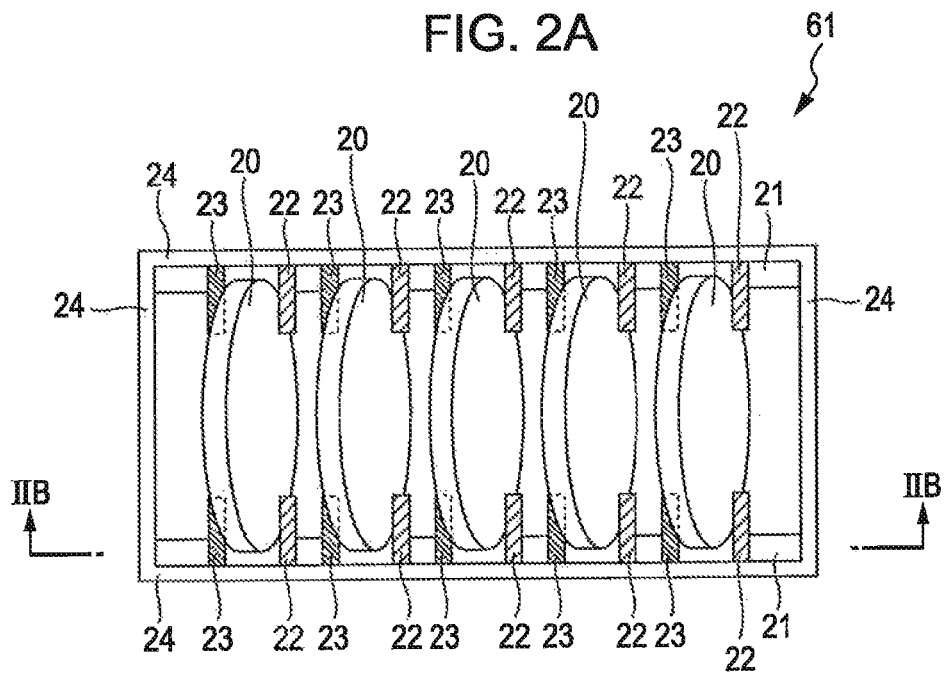
FIGS. 2A and 2B illustrate an exemplary cleaning apparatus.
Figure 2B:
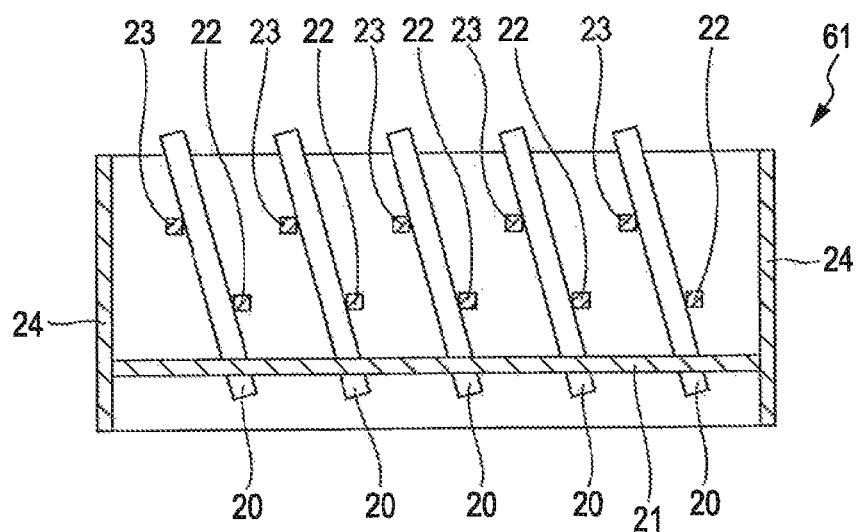

FIGS. 2A and 2B illustrate an exemplary cleaning apparatus. The inside of the recess 6g may be cleaned with the cleaning apparatus illustrated in FIGS. 2A and 2B. FIG. 2B is a cross-sectional view taken along the line IIB-IIB of FIG. 2A.

A cleaning apparatus 61 houses a plurality of semiconductor substrates 20. The cleaning apparatus 61 is provided with four wall members 24 such that a rectangular cylinder is formed. A supporting member 21 which supports semiconductor substrates 20 is provided inside of a pair of wall members 24. A plurality of lower locking members 22 are provided inside of the pair of wall members 24 at positions higher than the supporting member 21. A plurality of upper locking members 23 are provided at positions higher than the lower locking members 22 and sifted from the lower locking members 22 in plan view. The position in the horizontal direction of a semiconductor substrate 20 is determined by a pair of a lower locking member 22 and an upper locking member 23, and the position in the vertical direction of the semiconductor substrate 20 is determined by the supporting member 21. Since the upper locking member 23 is provided at a position different from that of the lower locking members 22 in plan view, a direction normal to the surface of the semiconductor substrate 20 is inclined from the horizontal direction.

Figure 3:
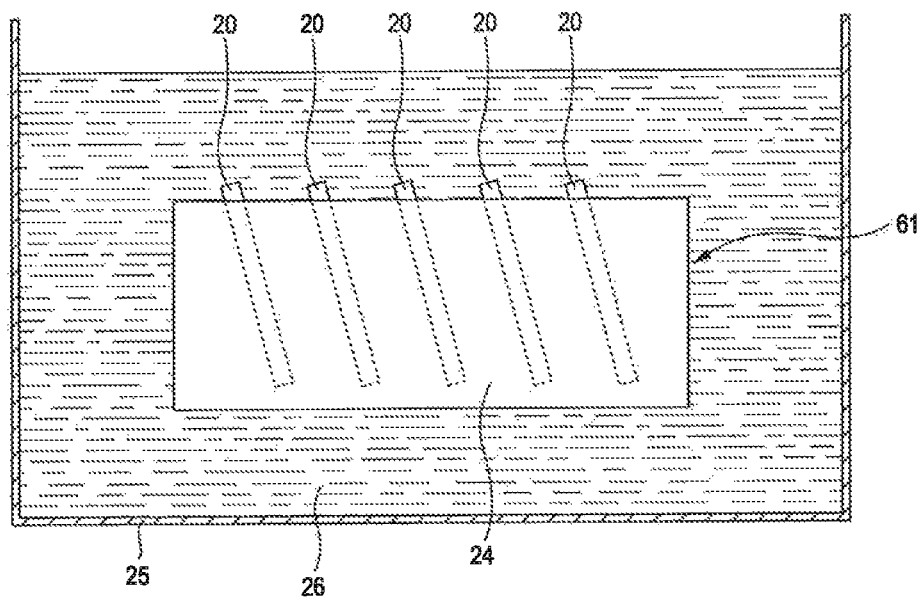
FIG. 3 illustrates an exemplary cleaning tank.

For example, a substrate 1 including a recess 6g and the like, as a semiconductor substrate 20, may be placed in the cleaning apparatus 61. FIG. 3 illustrates an exemplary cleaning tank. As illustrated in FIG. 3, the cleaning apparatus 61 is immersed in a cleaning solution 26 filled in a cleaning tank 25, and acid cleaning is performed. The cleaning solution 26 may include, for example, a sulfuric acid-hydrogen peroxide mixture or hydrofluoric acid. A sulfuric acid-hydrogen peroxide mixture may remove resist residues, and hydrofluoric acid may remove compound semiconductor residues. After acid cleaning is performed, water washing and spin drying may be performed.

In the acid cleaning, a reaction between the cleaning solution 26 and foreign substances on the semiconductor substrate 20 may cause bubbles to form. For example, on the surface of the semiconductor substrate 20 facing upward in the vertical direction, bubbles may float upward in the vertical direction. Retention of bubbles may be unlikely to occur on the surface, and the surface may be effectively cleaned. By reversing the semiconductor substrate 20, a surface opposite to the surface may be efficiently cleaned. For example, when the upper locking members 23 and/or the lower locking members 22 are moved in the horizontal direction, upper and lower surfaces are easily reversed. The angle of the normal direction of the surface of the semiconductor substrate 20 with respect to the horizontal direction may be 10° to 80°. For example, when the angle is less than 10°, bubbles generated on the lower portion of the surface facing upward in the vertical direction may pass in the vicinity of the surface and float up. As a result, uneven cleaning may occur. When the angle exceeds 80°, bubbles may be retained on the surface facing downward in the vertical direction, and the cleaning efficiency at the surface facing downward in the vertical direction may be decreased.

A plurality of semiconductor substrates 20 may be disposed with a distance between adjacent semiconductor substrates 20. For example, there may be no overlapping portions in plan view. Interference among a plurality of semiconductor substrates 20 may be reduced. As a result, bubbles generated on one semiconductor substrate 20 located at the lower position may not come into contact with another semiconductor substrate 20 located at the upper position, and cleaning efficiency of the other semiconductor substrate 20 may be improved.

Since bubbles generated during cleaning are efficiently removed, cleaning efficiency may be improved.

Figure 4A:
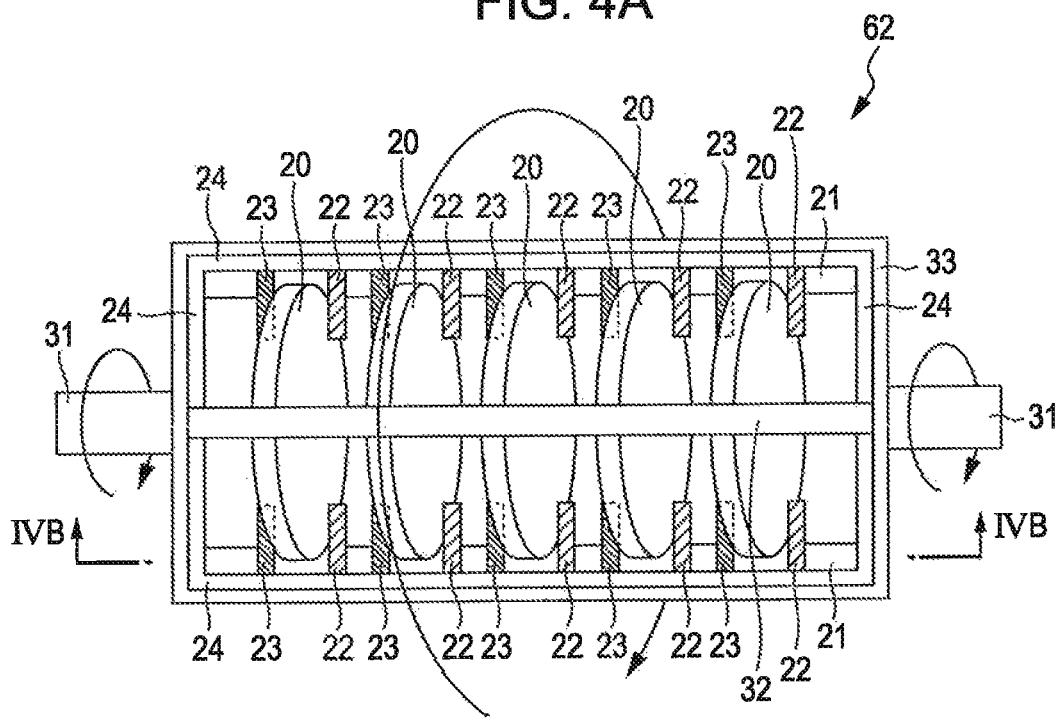
FIGS. 4A and 4B illustrate an exemplary cleaning apparatus.
Figure 4B:
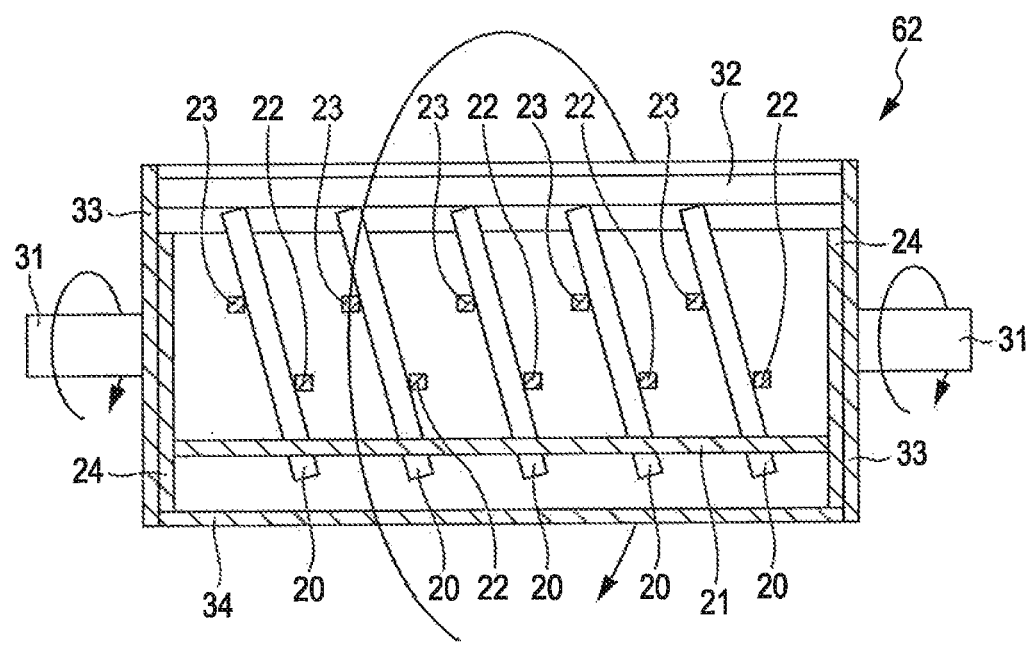

FIGS. 4A and 4B illustrate an exemplary cleaning apparatus. FIG. 4B is a cross-sectional view taken along the line IVB-IVB of FIG. 4A. FIGS. 5A and 5B illustrate an exemplary cleaning apparatus. FIG. 5B is a cross-sectional view taken along the line VB-VB of FIG. 5A. FIGS. 6A and 6B illustrate an exemplary cleaning apparatus. FIG. 6B is a cross-sectional view taken along the line VIB-VIB of FIG. 6A.

A cleaning apparatus 62 illustrated in FIGS. 4A and 4B includes a case 33 which supports four members 24 from the outside. A apparatus supporting member 34 which supports the wall members 24 from below is provided on the lower end of the case 33. The apparatus supporting member 34 may protrude inward from the lower end of the case 33 by a length that is substantially equal to the thickness of the supporting member 21 which supports semiconductor substrates 20. The cleaning apparatus 62 is provided with a holding member 32 which holds and fixes semiconductor substrates 20 from above and a rotary driving member 31 which rotates the case 33 around an axis extending in the horizontal direction.

When acid cleaning is performed using the cleaning apparatus 62, for example, as illustrated in FIG. 3, the cleaning apparatus 62 is immersed in a cleaning solution 26 filled in a cleaning tank 25, and the case 33 is rotated by the rotary driving member 31. Along with the rotation, two surfaces of each semiconductor substrate 20 alternately face upward in the vertical direction. Consequently, the two surfaces of the semiconductor substrate 20 may be cleaned with high efficiency. Since the holding member 32 is provided, dropping of semiconductor substrates 20 is reduced.

A cleaning apparatus 63 illustrated in FIGS. 5A and 5B is provided with a rod-like rotary driving member 41 which is in contact with the upper end of each of semiconductor substrates 20 and rotates around an axis extending in the horizontal direction.

When acid cleaning is performed using the cleaning apparatus 63, for example, as illustrated in FIG. 3, the cleaning apparatus 63 is immersed in a cleaning solution 26 filled in a cleaning tank 25, and the rotary driving member 41 rotates. Since the rotary driving member 41 is in contact with the upper ends of semiconductor substrates 20, along with the rotation, of the rotary driving member 41, the semiconductor substrates 20 rotate in a space surrounded by wall members 24. Retention of bubbles on two surfaces of each of the semiconductor substrates 20 is reduced, and the two surfaces are cleaned with high efficiency.

The cleaning apparatuses 61, 62, and 63 illustrated in FIGS. 2A and 2B, FIGS. 4A and 4B, or FIGS. 5A and 5B may be cleaning apparatuses for batch process. A cleaning apparatus 64 illustrated in FIGS. 6A and 6B may be a cleaning apparatus for single wafer process. The cleaning apparatus 64 is provided with linear portions 56a, 56b, and 56c which extend in three directions from a hub 54 having an opening 55 in the center thereof. Upper projections 51a, 51b, and 51c, which are to be brought into contact with the back surface of a semiconductor substrate, are provided on the upper surface side of the linear portions 56a, 56b, and 56e respectively. The upper projections 51a, 51b, and 51c each have a convexly curved top. Stoppers 53a, 53b, and 53c, which restrain movement of the semiconductor substrate in the horizontal direction, are provided on the upper surface side of the linear portions 56a, 56b, and 56c respectively. Lower projection 52a, 52b, and 52c are provided on the lower surface side of the linear portion 56a, 56b, and 56c respectively. The upper projections 51a, 51b, and 51e may have substantially the same height. The lower projections 52b and 52c may have substantially the same height. The height of the lower projection 52a may be smaller than the height of the lower projections 52b and 52c. A handle 57 is provided on the end of the linear portion 56a.

When acid cleaning is performed using the cleaning apparatus 64, a semiconductor substrate is placed on the upper projections 51a, 51b, and 51c, and using the handle 57, the cleaning apparatus 64 is immersed in a cleaning solution filled in a cleaning tank. When the cleaning apparatus 64 is placed on the bottom of the cleaning tank, because of the difference in height among the lower projections 52a, 52b, and 52c, a direction normal to the surface of the semiconductor substrate is inclined from the vertical direction, Bubbles generated on the lower surface of the semiconductor substrate may easily slip out upward, and the surface may be cleaned with high efficiency. The angle of the normal direction of the surface of the semiconductor substrate with respect to the vertical direction may be 10° to 80°. When the angle is less than 10°, bubbles may be retained on the surface facing downward in the vertical direction, When the angle exceeds 80°, bubbles generated on the lower portion of the surface facing upward in the vertical direction may pass in the vicinity of the surface and float up, resulting in occurrence of uneven cleaning. The inclination of the semiconductor substrate may be produced by the difference in height among the upper projections. Alternatively, the inclination of the semiconductor substrate may be produced by the differences in height among the upper projections and among the lower projections.

Figure 7A:
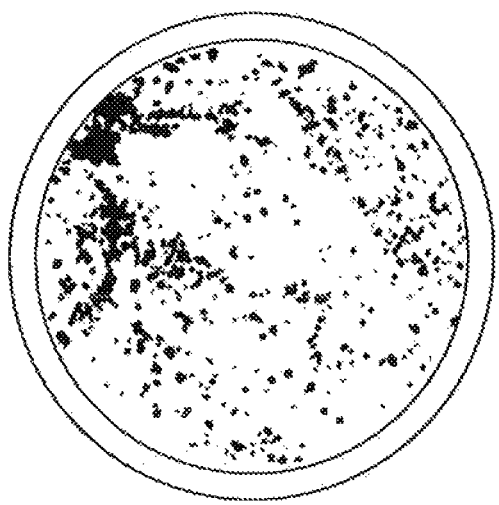
FIGS. 7A and 7B each illustrate exemplary residual particles.
Figure 7B:
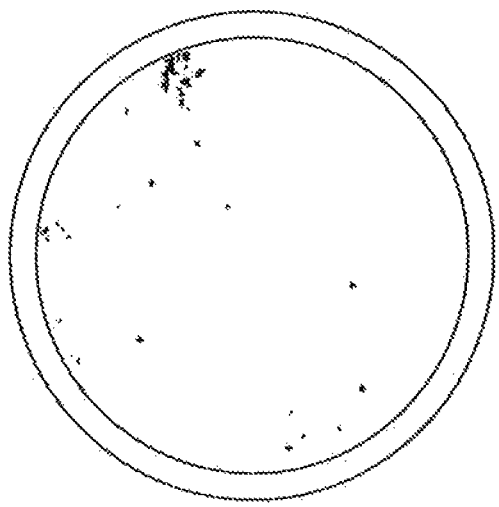

FIGS. 7A and 7B each illustrate exemplary residual particles. FIG. 7A illustrates residual particles when cleaning is performed using a cleaning apparatus which does not have an inclination with respect to a semiconductor substrate. FIG. 7B illustrates residual particles on a semiconductor substrate when acid cleaning is performed using a cleaning apparatus 64 illustrated in FIGS. 6A and 6B. In FIG. 7B, a larger amount of particles may be removed.

Before cleaning is performed, a cleaning apparatus may be subjected to ultraviolet treatment. Before a semiconductor substrate is placed in a cleaning apparatus, a carrier unit used for carrying the semiconductor substrate may be subjected to ultraviolet treatment. Before spin drying is performed subsequent to acid cleaning, a unit used for spin drying may be subjected to drying treatment.

The number of components included in a cleaning apparatus may be small. Components included in a cleaning apparatus may be integrated. When the number of components is large, foreign substances and the like that have fallen off owing to cleaning may remain in connections between the components, resulting in contamination of the semiconductor substrate.

Figure 8:
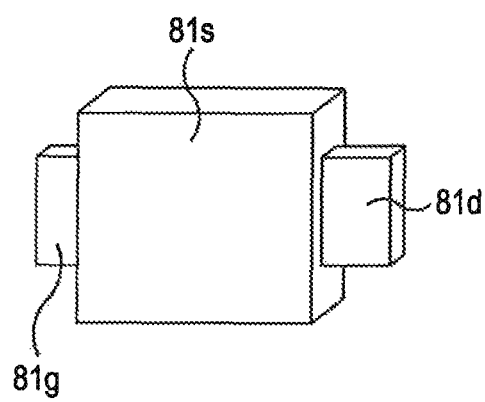
FIG. 8 illustrates an exemplary high-output amplifier.

A GaN-based HEMT fabricated using the cleaning apparatus described above may be used, for example, for a high-output amplifier. FIG. 8 illustrates an exemplary high-output amplifier. A source terminal 81s coupled to a source electrode is provided on a surface of a package. A gate terminal 81g coupled to a gate electrode and a drain terminal 81d coupled to a drain electrode extend from side surfaces of the package.

Figure 9A:
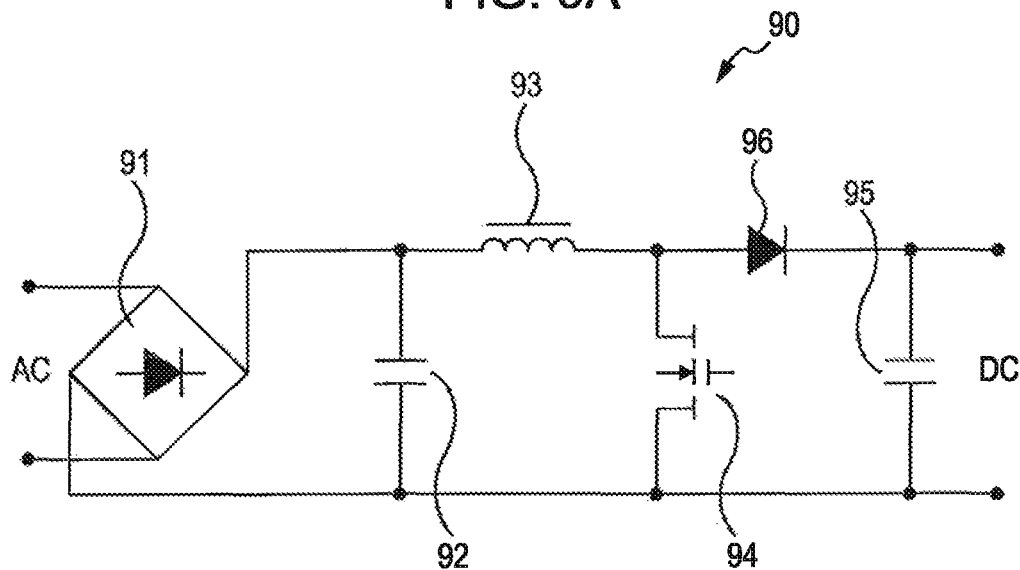
FIG. 9A illustrates an exemplary power factor correction (PFC) circuit.
Figure 9B:
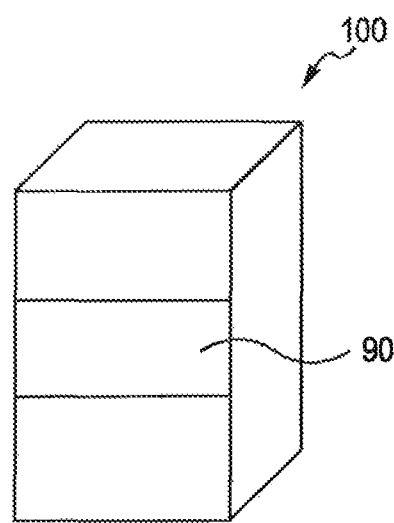
FIG. 9B illustrates an exemplary power supply device.

A GaN-based HEMT fabricated using the cleaning apparatus described above may be used, for example, for a power supply device. FIG. 9A illustrates an exemplary power factor correction (PFC) circuit. FIG. 9B illustrates an exemplary power supply device. The power supply device illustrated in FIG. 9B may be a server power supply and may include the PFC circuit illustrated in FIG. 9A.

As illustrated in FIG. 9A, a PFC circuit 90 includes a capacitor 92 coupled to a diode bridge 91 to which alternating current (AC) power is coupled. One terminal of a choke coil 93 is coupled to one terminal of the capacitor 92. One terminal of a switching element 94 and an anode of a diode 96 are coupled to another terminal of the choke coil 93. The switching element 94 may be a HEMT fabricated using the cleaning apparatus described above, and one terminal thereof may correspond to a drain electrode of the HEMT. Another terminal of the switching element 94 may correspond to a source electrode of the HEMT. One terminal of a capacitor 95 is coupled to a cathode of the diode 96. Another terminal of the capacitor 92, the other terminal of the switching element 94, and another terminal of the capacitor 95 are grounded. Direct current (DC) power is drawn between the terminals of the capacitor 95.

As illustrated in FIG. 9B, the PFC circuit 90 may be incorporated into a server power supply 100 or the like.

A PFC circuit may be used for a power supply device which operates at high speed, such as the server power supply 100 illustrated in FIG. 9B. A switching element, such as the switching element 94, may be used for a switching power supply or electronic device. The semiconductor device may be used as a component for a full bridge power circuit, such as a server power circuit.

The substrate may be a silicon carbide (SiC) substrate, sapphire substrate, silicon substrate, GaN substrate, GaAs substrate, or the like. The substrate may be conductive, semi-insulating, or insulating.

The structure of the gate electrode, the source electrode, or the drain electrode may be, for example, single-layered. When ohmic characteristics are obtained, heat treatment after formation of the source electrode and the drain electrode may be omitted. The gate electrode may be subjected to heat treatment.

The cleaning apparatus described above may be applied to fabrication of a semiconductor device other than a GaN-based HEMT.

Example embodiments of the present invention have now been described in accordance with the above advantages. It will be appreciated that these examples are merely illustrative of the invention. Many variations and modifications will be apparent to those skilled in the art.

What is claimed is:

1. A method of cleaning a semiconductor substrate comprising:

placing the semiconductor substrate in a cleaning apparatus which includes a case for surrounding the semiconductor substrate, a supporting member for supporting the semiconductor substrate and a locking member for supporting the semiconductor substrate by a lower locking member and an upper locking member located above the lower locking member so as to lock the semiconductor substrate inclined with respect to the vertical direction and the horizontal direction, the lower locking member extending, along a first surface of an inclined semiconductor surface, from a first inside wall of the case and a second inside wall of the case, which is opposite to the first inside wall, and supporting only the first surface of the inclined semiconductor substrate, the upper locking member extending, along a second surface of the inclined semiconductor substrate, from the first inside wall of the case and the second inside wall of the case and supporting only the second surface of the inclined semiconductor substrate, the first inside wall and the second inside wall facing a lateral side of the inclined semiconductor substrate, the first surface directing upward and the second surface directing downward;

immersing the semiconductor substrate in a cleaning solution including an acid; and rotating the semiconductor substrate by a rotary driving member.

2. The method of cleaning a semiconductor substrate according to claim 1, wherein the inclined semiconductor substrate is rotated by the rotary driving member while a holding member which is in contact with a top portion of the inclined semiconductor substrate holds the inclined semiconductor substrate from above.

3. A cleaning apparatus comprising:

a case to surround a semiconductor substrate;

a supporting member to support the semiconductor substrate; and a locking member to lock the semiconductor substrate such that the semiconductor substrate is inclined with respect to the vertical direction and the horizontal direction by a lower locking member and an upper locking member located above the lower locking member, the lower locking member extending, along a first surface of an inclined semiconductor surface, from a first inside wall of the case and a second inside wall of the case, which is opposite to the first inside wall, and supporting only the first surface of the inclined semiconductor substrate, the upper locking member extending, along a second surface of the inclined semiconductor substrate, from the first inside wall of the case and the second inside wall of the case and supporting only the second surface of the inclined semiconductor substrate, the first inside wall and the second inside wall facing a lateral side of the inclined semiconductor substrate, the first surface directing upward and the second surface directing downward; and a rotary driving member to rotate the inclined semiconductor substrate in the cleaning apparatus.

4. The cleaning apparatus according to claim 3, further comprising, a holding member, which is in contact with a top portion of the inclined semiconductor substrate, to hold the inclined semiconductor substrate from above.

5. A method of manufacturing a semiconductor device comprising:

placing a semiconductor substrate in a cleaning apparatus which includes a case for surrounding the semiconductor substrate, a supporting member for supporting the semiconductor substrate and a locking member for supporting the semiconductor substrate by a lower locking member and an upper locking member located above the lower locking member so as to lock the semiconductor substrate inclined with respect to the vertical direction and the horizontal direction, the lower locking member extending, along a first surface of an inclined semiconductor surface, from a first inside wall of the case and a second inside wall of the case, which is opposite to the first inside wall, and supporting only the first surface of the inclined semiconductor substrate, the upper locking member extending, along a second surface of the inclined semiconductor substrate, from the first inside wall of the case and the second inside wall of the case and supporting only the second surface of the inclined semiconductor substrate, the first inside wall and the second inside wall facing a lateral side of the inclined semiconductor substrate, the first surface directing upward and the second surface directing downward;

immersing the inclined semiconductor substrate in a cleaning solution including an acid; and rotating the inclined semiconductor substrate by a rotary driving member.

6. The method of manufacturing a semiconductor device according to claim 5, including:

performing an ultraviolet treatment on the cleaning apparatus before the semiconductor substrate is placed in the cleaning apparatus.

7. The method of manufacturing a semiconductor device according to claim 5, including:

performing a ultraviolet treatment on a carrier unit for carrying the semiconductor substrate to the cleaning apparatus before the semiconductor substrate is placed in the cleaning apparatus.

8. The method of manufacturing a semiconductor device according to claim 5, wherein the inclined semiconductor substrate is rotated by the rotary driving member while a holding member which is in contact with a top portion of the inclined semiconductor substrate holds the inclined semiconductor substrate from above.

* * * * *